United States Patent
Xie et al.

(10) Patent No.: US 8,984,463 B2
(45) Date of Patent: Mar. 17, 2015

(54) DATA TRANSFER ACROSS POWER DOMAINS

(71) Applicant: QUALCOMM Incorporated, San Diego, CA (US)

(72) Inventors: Jing Xie, University Park, PA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 103 days.

(21) Appl. No.: 13/792,592

(22) Filed: Mar. 11, 2013

(65) Prior Publication Data

US 2014/0146630 A1    May 29, 2014

Related U.S. Application Data

(60) Provisional application No. 61/730,767, filed on Nov. 28, 2012, provisional application No. 61/730,755, filed on Nov. 28, 2012.

(51) Int. Cl.
| | |
|---|---|
| *G06F 17/50* | (2006.01) |
| *H01L 23/522* | (2006.01) |
| *G11C 5/14* | (2006.01) |
| *G06F 1/32* | (2006.01) |

(52) U.S. Cl.
CPC ........ *G06F 17/5072* (2013.01); *H01L 23/5226* (2013.01); *G06F 17/5068* (2013.01); *G11C 5/14* (2013.01); *G06F 1/32* (2013.01); *G06F 2217/62* (2013.01); *H01L 2924/0002* (2013.01)
USPC ......................................... 716/120; 716/132

(58) Field of Classification Search
None
See application file for complete search history.

(56) References Cited

U.S. PATENT DOCUMENTS

| | | | |
|---|---|---|---|
| 5,606,186 | A | 2/1997 | Noda |
| 5,636,125 | A | 6/1997 | Rostoker et al. |
| 5,724,557 | A | 3/1998 | McBean, Sr. |
| 6,040,203 | A | 3/2000 | Bozso et al. |

(Continued)

FOREIGN PATENT DOCUMENTS

| | | |
|---|---|---|
| EP | 1432032 A2 | 6/2004 |
| EP | 2551898 A1 | 1/2013 |

(Continued)

OTHER PUBLICATIONS

Khan et al., "A Single Supply Level Shifter for Multi-Voltage Systems," 2006 IEEE Proceedings of the 19th International Conference on VLSI Design (VLSID'06), 4 pages.*

(Continued)

*Primary Examiner* — Leigh Garbowski
(74) *Attorney, Agent, or Firm* — Nicholas J. Pauley; Peter Michael Kamarchik; Joseph Agusta (57) ABSTRACT

The disclosed embodiments comprise a multi-stage circuit operating across different power domains. The multi-stage circuit may be implemented as a master-slave flip-flop circuit integrated with a level shifter that transfers data across different power domains. The master and slave stages of the flip-flop may be split across two tiers of a 3D IC and may include (i) a level shifter across different power domain integrated within the flip-flop circuit, (ii) reduced one-state writing delays by a self-induced power collapsing technique, (iii) splitting flip-flop power supplies in different tiers using monolithic 3D IC technology, and (iv) cross power domain data transfer between 3D IC tiers.

38 Claims, 8 Drawing Sheets

(56) References Cited

U.S. PATENT DOCUMENTS

| | | | |
|---|---|---|---|
| 6,125,217 A | 9/2000 | Paniccia et al. | |
| 6,260,182 B1 | 7/2001 | Mohan et al. | |
| 6,295,636 B1 | 9/2001 | Dupenloup | |
| 6,305,001 B1 | 10/2001 | Graef | |
| 6,374,200 B1 | 4/2002 | Nakagawa | |
| 6,448,168 B1 | 9/2002 | Rao et al. | |
| 6,627,985 B2 | 9/2003 | Huppenthal et al. | |
| 6,727,530 B1 | 4/2004 | Feng et al. | |
| 6,754,877 B1 | 6/2004 | Srinivasan | |
| 6,834,380 B2 | 12/2004 | Khazei | |
| 6,846,703 B2 | 1/2005 | Shimoda et al. | |
| 6,965,527 B2 | 11/2005 | Fasoli et al. | |
| 6,979,630 B2 | 12/2005 | Walitzki | |
| 7,107,200 B1 | 9/2006 | Korobkov | |
| 7,173,327 B2 | 2/2007 | Siniaguine | |
| 7,209,378 B2 | 4/2007 | Nejad et al. | |
| 7,280,397 B2 | 10/2007 | Scheuerlein | |
| 7,288,418 B2 | 10/2007 | Barge et al. | |
| 7,298,641 B2 | 11/2007 | Madurawe | |
| 7,356,781 B2 | 4/2008 | Koeder et al. | |
| 7,459,716 B2 | 12/2008 | Toda et al. | |
| 7,546,571 B2 | 6/2009 | Mankin et al. | |
| 7,579,654 B2 | 8/2009 | Couillard et al. | |
| 7,622,955 B2 * | 11/2009 | Vilangudipitchai et al. | 326/68 |
| 7,653,884 B2 | 1/2010 | Furnish et al. | |
| 7,663,620 B2 | 2/2010 | Robertson et al. | |
| 7,669,152 B1 | 2/2010 | Tcherniaev et al. | |
| 7,796,092 B2 | 9/2010 | Holly et al. | |
| 7,877,719 B2 | 1/2011 | He | |
| 7,964,916 B2 | 6/2011 | Or-Bach et al. | |
| 7,969,193 B1 | 6/2011 | Wu et al. | |
| 7,989,226 B2 | 8/2011 | Peng | |
| 8,006,212 B2 | 8/2011 | Sinha et al. | |
| 8,026,521 B1 | 9/2011 | Or-Bach et al. | |
| 8,046,727 B2 | 10/2011 | Solomon | |
| 8,059,443 B2 | 11/2011 | McLaren et al. | |
| 8,060,843 B2 | 11/2011 | Wang et al. | |
| 8,114,757 B1 | 2/2012 | Or-Bach et al. | |
| 8,115,511 B2 | 2/2012 | Or-Bach | |
| 8,136,071 B2 | 3/2012 | Solomon | |
| 8,146,032 B2 | 3/2012 | Chen et al. | |
| 8,164,089 B2 | 4/2012 | Wu et al. | |
| 8,208,282 B2 | 6/2012 | Johnson et al. | |
| 8,218,377 B2 * | 7/2012 | Tandon et al. | 365/189.11 |
| 8,222,696 B2 | 7/2012 | Yamazaki et al. | |
| 8,230,375 B2 | 7/2012 | Madurawe | |
| 8,258,810 B2 | 9/2012 | Or-Bach et al. | |
| 8,332,803 B1 | 12/2012 | Rahman | |
| 8,450,804 B2 | 5/2013 | Sekar et al. | |
| 8,576,000 B2 | 11/2013 | Kim et al. | |
| 8,683,416 B1 | 3/2014 | Trivedi et al. | |
| 8,701,073 B1 | 4/2014 | Fu et al. | |
| 8,803,206 B1 | 8/2014 | Or-Bach et al. | |
| 8,803,233 B2 | 8/2014 | Cheng et al. | |
| 2004/0036126 A1 | 2/2004 | Chau et al. | |
| 2004/0113207 A1 | 6/2004 | Hsu et al. | |
| 2004/0241958 A1 | 12/2004 | Guarini et al. | |
| 2005/0280061 A1 | 12/2005 | Lee | |
| 2006/0190889 A1 | 8/2006 | Cong et al. | |
| 2007/0040221 A1 | 2/2007 | Gossner et al. | |
| 2007/0147157 A1 | 6/2007 | Luo et al. | |
| 2007/0244676 A1 | 10/2007 | Shang et al. | |
| 2008/0276212 A1 | 11/2008 | Albrecht et al. | |
| 2008/0283995 A1 | 11/2008 | Bucki et al. | |
| 2008/0291767 A1 | 11/2008 | Barnes et al. | |
| 2009/0174032 A1 | 7/2009 | Maejima et al. | |
| 2010/0115477 A1 | 5/2010 | Albrecht et al. | |
| 2010/0140790 A1 | 6/2010 | Setiadi et al. | |
| 2010/0193770 A1 | 8/2010 | Bangsaruntip et al. | |
| 2010/0229142 A1 | 9/2010 | Masleid et al. | |
| 2010/0276662 A1 | 11/2010 | Colinge | |
| 2011/0049594 A1 | 3/2011 | Dyer et al. | |
| 2011/0059599 A1 | 3/2011 | Ward et al. | |
| 2011/0078222 A1 | 3/2011 | Wegener | |
| 2011/0084314 A1 | 4/2011 | Or-Bach et al. | |
| 2011/0121366 A1 | 5/2011 | Or-Bach et al. | |
| 2011/0215300 A1 | 9/2011 | Guo et al. | |
| 2011/0221502 A1 | 9/2011 | Meijer et al. | |
| 2011/0222332 A1 | 9/2011 | Liaw et al. | |
| 2011/0253982 A1 | 10/2011 | Wang et al. | |
| 2011/0272788 A1 | 11/2011 | Kim et al. | |
| 2011/0280076 A1 | 11/2011 | Samachisa et al. | |
| 2011/0298021 A1 | 12/2011 | Tada et al. | |
| 2012/0012972 A1 | 1/2012 | Takafuji et al. | |
| 2012/0056258 A1 | 3/2012 | Chen | |
| 2012/0129276 A1 | 5/2012 | Haensch et al. | |
| 2012/0129301 A1 | 5/2012 | Or-Bach et al. | |
| 2012/0152322 A1 | 6/2012 | Kribus et al. | |
| 2012/0171108 A1 | 7/2012 | Kim et al. | |
| 2012/0181508 A1 | 7/2012 | Chang et al. | |
| 2012/0193621 A1 | 8/2012 | Or-Bach et al. | |
| 2012/0195136 A1 | 8/2012 | Yoko | |
| 2012/0217479 A1 | 8/2012 | Chang et al. | |
| 2012/0280231 A1 | 11/2012 | Ito et al. | |
| 2012/0286822 A1 | 11/2012 | Madurawe | |
| 2012/0304142 A1 | 11/2012 | Morimoto et al. | |
| 2012/0305893 A1 | 12/2012 | Colinge | |
| 2012/0313227 A1 | 12/2012 | Or-Bach et al. | |
| 2013/0026539 A1 | 1/2013 | Tang et al. | |
| 2013/0026608 A1 | 1/2013 | Radu | |
| 2013/0148402 A1 | 6/2013 | Chang et al. | |
| 2013/0299771 A1 | 11/2013 | Youn et al. | |
| 2014/0008606 A1 | 1/2014 | Hussain et al. | |
| 2014/0035041 A1 | 2/2014 | Pillarisetty | |
| 2014/0085959 A1 | 3/2014 | Saraswat et al. | |
| 2014/0097868 A1 | 4/2014 | Ngai | |
| 2014/0225218 A1 | 8/2014 | Du | |
| 2014/0225235 A1 | 8/2014 | Du | |
| 2014/0269022 A1 | 9/2014 | Xie et al. | |

FOREIGN PATENT DOCUMENTS

| | | |
|---|---|---|
| FR | 2973938 A1 | 10/2012 |
| JP | H06204810 A | 7/1994 |
| JP | 2001160612 A | 6/2001 |
| KR | 20010109790 A | 12/2001 |
| KR | 20080038535 A | 5/2008 |
| WO | 2011112300 A1 | 9/2011 |
| WO | 2012113898 A1 | 8/2012 |
| WO | 2013045985 A1 | 4/2013 |

OTHER PUBLICATIONS

Kulkarni et al., "Capacitive-Coupling Wordline Boosting with Self-Induced Vcc Collapse for Write Vmin Reduction in 22-nm 8T SRAM," 2012 IEEE International Solid-State Circuits Conference, pp. 234-236.*

Lin et al., "A New Family of Sequential Elements With Built-in Soft Error Tolerance for Dual-VDD Systems," IEEE Transactions on Very Large Scale Integration (VLSI) Systems, vol. 16, No. 10, Oct. 2008, pp. 1372-1384.*

Arunachalam V., et al., "Low-power clock distribution in microprocessor", Proceedings of the 18th ACM Great Lakes Symposium on VLSI, GLSVLSI '08, Jan. 1, 2008, 3 pages, XP055106715, New York, USA DOI: 10.1145/1366110.1366212 ISBN: 978-1-59-593999-9 p. 429-p. 434.

Donno M., et al., "Power-aware clock tree planning", Proceedings of the 2004 International Symposium on Physical Design, ISPD '04, Jan. 1, 2004, 5 pages, XP055106989, New York, New York, USA DOI: 10.1145/981066.981097 ISBN: 978-1-58-113817-7 p. 140-p. 144.

Ganguly S., et al., "Clock distribution design and verification for PowerPC microprocessors", Computer-Aided Design, 1997, Digest of Technical Papers., 1997 IEEE/ACM International Conference on San Jose, CA, USA Nov. 9-13, 1997, Los Alamitos, CA, USA, IEEE Comput. Soc, US, Nov. 5, 1995, pp. 58-61, XP032372227, DOI: 10.1109/ICCAD.1995.479991 ISBN: 978-0-8186-8200-1 p. 58-p. 61.

Tsao C.W.A., et al., "UST/DME: a clock tree router for general skew constraints", Computer Aided Design, 2000, ICCAD-2000, IEEE/

(56) References Cited

OTHER PUBLICATIONS

ACM International Conference on, IEEE, Nov. 5, 2000, pp. 400-405, XP032402965, DOI: 10.1109/ICCAD.2000.896505 ISBN: 978-0-7803-6445-5 p. 400-p. 401.
Co-pending U.S. Appl. No. 13/784,915, filed Mar. 5, 2013.
Co-pending U.S. Appl. No. 13/788,224, filed Mar. 7, 2013.
Co-pending U.S. Appl. No. 13/792,384, filed Mar. 11, 2013.
Co-pending U.S. Appl. No. 13/792,468, filed Mar. 11, 2013.
Xie J., et al., "CPDI: Cross-power-domain interface circuit design in monolithic 3D technology", Quality Electronic Design (ISQED), 2013 14th International Symposium on, IEEE, Mar. 4, 2013, pp. 442-447, XP032418452, DOI: 10.1109/ISQED.2013.6523649 ISBN: 978-1-4673-4951-2 Section II. "Monolithic 3D Technology"; figures 1,3.
Ishihara, Fujio et al., "Level Conversion for Dual-Supply Systems", IEEE Transactions on Very Large Scale Integration (VLSI) Systems, vol. 12, No. 2, Feb. 2004, p. 185-195.
Hamada, Mototsugu et al., "A Top-Down Low Power Design Technique Using Clustered Voltage Scaling with Variable Supply-Voltage Scheme", IEEE 1998 Custom Integrated Circuits Conference, p. 495-498.
Papanikolaou et al., "Three Dimensional System Integration", Springer, IC Stacking Process and Design, Jan. 2011; IS8N 978-1-4419-0962-6; pp. 1-246.
Cong J. et al., "An automated design flow for 3d microarchitecture evaluation", Design Automation, 2006, Asia and South Pacific Conference on Jan. 24, 2006, Piscataway, NJ, USA, IEEE, Jan. 24, 2006, pp. 384-389, XP010899545, DOI: 10.1109/ASPDAC.2006. 1594713, ISBN: 978-0-7803-9451-3, the whole document.
Friedman, E. G., "Clock Distribution Networks in Synchronous Digital Integrated Circuits", 2001, IEEE, Proceedings of the IEEE, vol. 89, No. 5, pp. 665-692.
Jain A. et al., "Thermala electrical co-optimisation of floorplanning of three-dimensionai integrated circuits under manufacturing and physical design constraints", IET Computers and Digital Techniques,, vol. 5, No. 3, May 9, 2011, pp. 169-178, XP006037867, ISSN: 1751-861X, DOI:10.1049/1ET-CDT:20090107, pp. 170-172.
Kim, T-Y., et al., "Clock Tree Syntheis for TSV-Based 3d IC designs", Oct. 2011, ACM, ACM Transactions on Design Automation of Electronic Systems, vol. 16, No. 4m Article 48, pp. 48:1-48:21.
Lin, C-T., et al., "CAD reference flow for 3d Via-Last Integrated Circuits", 2010, IEEE, pp. 187-192.
Loh, Gabriel H. et al., "Processor design in 3D die-stacking technologies," IEEE 2007 p. 31-48.
Minz J. et al., "Block-level 3-D Global Routing With an Application to 3-D Packaging", IEEE Transactions on Computer-Aided Design of Integrated Circuits and Systems, vol. 25, No. 10, Oct. 1, 2006, pp. 2248-2257, XP055137904, ISSN: 0278-0070,DOI:10.1109/TCAD. 2005.860952 p. 2249-p. 2252.
Minz J. et al., "Channel and Pin Assignment for Three Dimensional Packaging Routing", May 24, 2004, pp. 1-6, XP055138056, Georgia Tech. Library. CERCS; GIT-CERCS-04-21, Retrieved from the Internet: URL:http://www.ceres.gatech.edu/tech-reports/tr2004/git-cercs-04-21.pdf.
International Search Report and Written Opinion—PCT/US2013/072374—ISA/EPO—Nov. 11, 2014.

\* cited by examiner

FIG. 1

| ELEMENT | CONTRIBUTION TO IC POWER CONSUMPTION | CONTRIBUTION TO IC AREA CONSUMPTION | CONTRIBUTION TO IC WRITE TIME DELAY |
|---|---|---|---|
| Conventional Level Shifter + FF Design | 1.00 | 1.00 | 1.00 |
| Level Shift Storage 61, 63 | 0.50 | 0.50 | 0.50 |
| Isolation Circuitry 42 | 0.00 | 0.125 | 0.00 |
| Write enhancement 65 | 0.00 | 0.125 | 0.00 |
| Combined Second Stage Circuitry 60 | 0.50 | 0.75 | 0.50 |

DATA TRANSFER ACROSS POWER DOMAINS

CLAIM OF PRIORITY UNDER 35 U.S.C. §119

The present application for patent claims priority to the following:
Provisional Application No. 61/730,767 entitled "DATA TRANSFER ACROSS POWER DOMAINS," filed Nov. 28, 2012, and assigned to the assignee hereof and hereby expressly incorporated by reference herein.
Provisional Application No. 61/730,755 entitled "CLOCK DISTRIBUTION NETWORK FOR 3D INTEGRATED CIRCUIT," filed Nov. 28, 2012, and assigned to the assignee hereof and hereby expressly incorporated by reference herein.

REFERENCE TO CO-PENDING APPLICATIONS FOR PATENT

The present application for patent is related to the following co-pending U.S. patent application(s):
"MONOLITHIC 3D IC FLIP-FLOP DESIGN" by Yang Du, Jing Xie and Kambiz Samadi, filed Mar. 5, 2013, assigned to the assignee hereof, and expressly incorporated by reference herein;
"MONOLITHIC THREE DIMENSIONAL INTEGRATION OF SEMICONDUCTOR INTEGRATED CIRCUITS" by Yang Du, filed Mar. 7, 2013, assigned to the assignee hereof, and expressly incorporated by reference herein; and
"CLOCK DISTRIBUTION NETWORK FOR 3D INTEGRATED CIRCUIT" by Kambiz Samadi, Shreepad Panth, Jing Xie and Yang Du, filed [****], assigned to the assignee hereof, and expressly incorporated by reference herein.

FIELD OF DISCLOSURE

The disclosed embodiments are directed in general to the efficient transfer of data from one power domain to another different power domain in integrated circuits. More specifically, the disclosed embodiments are directed to systems and methods for transferring data from one power domain to another power domain in low power integrated circuits while optimizing area consumption, power consumption, write time delay, cross-talk across power domains, and other performance parameters.

BACKGROUND

In digital circuits the two logical states of a wire are usually represented by two different voltages. When a wire voltage is below a predetermined threshold, the signal on the wire is read as "low." When a wire voltage is above a predetermined threshold, the signal on the wire is read as "high." A logic high voltage is often referred to as Vdd, and a logic low voltage is often referred to as Vss, which is the digital "ground." In modern digital logic systems, different Vdd levels are often utilized for different functional circuit blocks to manage system performance and power consumption. For example, certain circuit blocks do not need to operate as fast as other circuit blocks. Therefore, the Vdd for certain circuit blocks may be set at a different level than the Vdd for other circuit blocks. A functional circuit block's Vdd level is often referred to as the circuit block's power domain. When digital signals are transferred from a circuit block operating in one power domain to a circuit block operating in another power domain, the signals need to be converted from one power domain to another. Level shifter circuitry shifts signals from one power domain to another, and is often used as an interface between a functional circuit block operating in power domain A and a functional block operating in power domain B. Providing multiple power domains also requires multiple power rails, which increases power rail physical routing congestion on the integrated circuit.

Power consumption and area efficiency are critical problems in today's small, high-speed and high-performance mobile applications. In so-called system-on-chip (SoC) designs, a common technique to reduce power consumption is to divide the system into different power domains. For example, at a coarse level, computational logic and cache can be designed to operate at their own supply voltages. In systems that provide multiple processing cores on the same chip (i.e., multi-core systems), multiple power domains are required to facilitate dynamic voltage and frequency scaling (DVFS) for each core. Generally, providing finer granularity power domains is known to reduce system power effectively and is considered an attractive approach to addressing the power wall problem. As described above, multi-domain designs require some type of level shifter circuitry at the domain boundary to assure reliable cross domain data transfer and manage cross domain data traffic. However, known attempts to provide level shifter circuitry in small, high-speed and high-performance applications have been impractical because of inefficiencies in various performance parameters, such as area consumption, power consumption, write time delay, power rail congestion, and others. These challenges have hindered the widespread acceptance of fine-grained multi-power domain system designs.

Examples of known attempts to integrate a level shifter with a multi-stage flip-flop (e.g., a master-slave flip-flop) that operates across multiple power domains include Fujio Ishiha, *Level conversion for Dual-Supply Systems*, in Trans. VLSI System, 2004; and H. Mahmoodi-Meimand, *A top-down low power design technique using clustered voltage scaling with variable supply-voltage scheme*, in Proc. CICC, 1998. However, the induced area penalty and difficulties of providing multi-power supply voltages within local cell levels inhibits the broad acceptance in 2D IC designs. The deficiencies of these designs include (i) the presence of a feedback signal path from the high power stage through the pass gate to the low power stage, and (ii) a lack of write enhancement considerations on the level shifter stage, which increases delay, leakage and dynamic power. These deficiencies are even more severe in smaller feather size designs.

Accordingly, there is a need for integrated circuit level shifter designs and implementation techniques that address and improve various performance parameters including area consumption, power consumption, cross-talk across power domains, write time delay, power rail congestion, and others.

SUMMARY

The disclosed embodiments provide devices and methods for implementing a cross power domain interface that reliably and effectively transfers synchronized data between storage elements operating in two different power domains. The storage elements may be implemented as a master-slave flip-flop circuit wherein the master flip-flop operates in one power domain and the slave flip-flop operates in another power domain. The master stage in one power domain determines the flip-flop setup & hold times, and the slave stage determines clock-Q and also functions as a logic level shifter. The slave flip-flop and level shifter may be implemented as a header cell and 6 transistor SRAM cell that can be sized for easy writing, high speed and low switching energy. The disclosed embodiments resolve isolation problems using isolation circuitry, which may be implemented as a differential pair of common source n-channel MOSFETs in a data path between the first power domain and the second power domain. A write enhancement circuit is provided to enhance level conversion efficiency (i.e., logic one write enhancement) and reduce conversion power. The header cell may include write enhancement functionality that may be implemented as an "always on" p-channel MOSFET header that provides self-induced power ($V_{dd}$) collapsing. Further advantages are achieved by implementing the cross power domain interface in a dual-tier monolithic 3D IC. The two power rails of the cross power domain interface are readily arranged in two separate tiers of the 3D IC, thereby reducing the power rail physical routing congestion problem.

One aspect of the disclosed embodiments provides a multi-tier integrated circuit having a multi-stage circuit configuration that includes a first stage operating in power domain A; a second stage operating in power domain B; the first stage having first means for storing data; the second stage having means for level shifting and storing data; a first tier; a second tier; the first tier comprising the first stage and means for providing power to the first stage; and the second tier comprising the second stage and means for providing power to the second stage. The means for providing power to the first stage may comprise a first power rail, and the means for providing power to the second stage may comprise a second power rail. The multi-tier circuit may include means for transporting data between the first stage and said second stage, and the means for transporting data may comprises a network of vias. The vias may comprise monolithic inter-tier vias.

Another aspect of the disclosed embodiments provides a method of designing a multi-stage circuit, the steps comprising: designing a first stage circuit operating in power domain A; designing a second stage circuit operating in power domain B; incorporating level shifter storage circuitry into said second stage circuit, wherein said level shifter storage circuitry shifts data received at power domain A to power domain B, and writes said shifted data to said level shifter storage circuitry; locating said first stage circuit and a first stage power rail on a first tier of a multi-tier configuration; and locating said second stage circuit and a second stage power rail on a second tier of said multi-tier configuration.

Another aspect of the disclosed embodiments provides a method of designing a multi-stage circuit, the steps comprising, designing a first stage storage circuit operating in power domain A; designing a second stage circuitry operating in power domain B; incorporating level shifter storage circuitry into said second stage circuitry, wherein said level shifter storage circuitry includes level shift functionality that shifts received data from power domain A to power domain B, and writes said shifted data to said level shifter storage circuitry; incorporating write enhancement functionality into said level shifter storage circuitry, wherein said write enhancement circuitry improves an efficiency of writing said shifted data to said level shifter storage circuitry; reducing a size and a power consumption of said level shifter storage circuitry; incorporating isolation circuitry into said second storage circuitry, wherein said isolation circuitry limits cross talk between said first stage storage circuitry operating in power domain A and said second stage circuitry operating in power domain B; further adjusting said design or reducing said size or power consumption of said level shifter storage circuitry, if necessary; and adjusting said design, size and/or power consumption of said isolation circuitry, if necessary. The method further includes the steps of evaluating whether said size, power consumption and/or writing efficiency of said second stage circuitry are optimized; further adjusting said design or reducing said size or power consumption of said level shifter storage circuitry, if necessary; and adjusting said design, size and/or power consumption of said isolation circuitry, if necessary.

BRIEF DESCRIPTION OF THE DRAWINGS

The accompanying drawings are presented to aid in the description of disclosed embodiments and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the terms "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Turning now to an overview of the relevant operating environment, fine grain multi-power domains are advantageous in modern SoC (i.e., System on Chip) designs for performance and power management. Synchronized data transfer across power domains requires a logic level shifter. The cross domain level shifter further requires different power supplies which could lead to significant area penalty and $V_{dd}$ crossing between domains. Additionally, data transfer across these power domains imposes many challenges including, for example, (1) the need for additional level shifters leads to significant area consumption; (2) a cross domain level shifter risks $V_{dd}$ tripping between domains; (3) multiple power supply rails at the local cell level also lead to further area penalty. To overcome these and other issues, the disclosed embodiments propose a storage element with an integrated level shifter as a compact cross domain data transfer interface. The disclosed embodiments further employ 3D integrated circuit technology to split power supplies into separate tiers, thereby avoiding local power rail congestion and further minimizing cross talk.

As described and illustrated in more detail below, the storage element may be implemented as a flip-flop circuit integrated with a level shifter that transfers data across different power domains utilizing monolithic 3D technology. The embodiments are generally in the field of low power digital integrated circuits (IC) and 3D IC designs. More specifically, the present disclosure describes the circuit topology and monolithic 3D IC implementation of a cross domain data transfer interface by integrating a level shifter inside a master-slave flip-flop and providing a data path across different power domains arranged in different 3D IC tiers, comprising (i) a flip-flop (FF) circuit, (ii) a level shifter across different power domains integrated within the FF circuit, (iii) reduce write time delays by a self-induced power collapsing technique, (iv) splitting FF power supplies in different tiers using monolithic 3D IC technology, and (v) cross power domain data transfers between 3D IC tiers.

Figure 1:
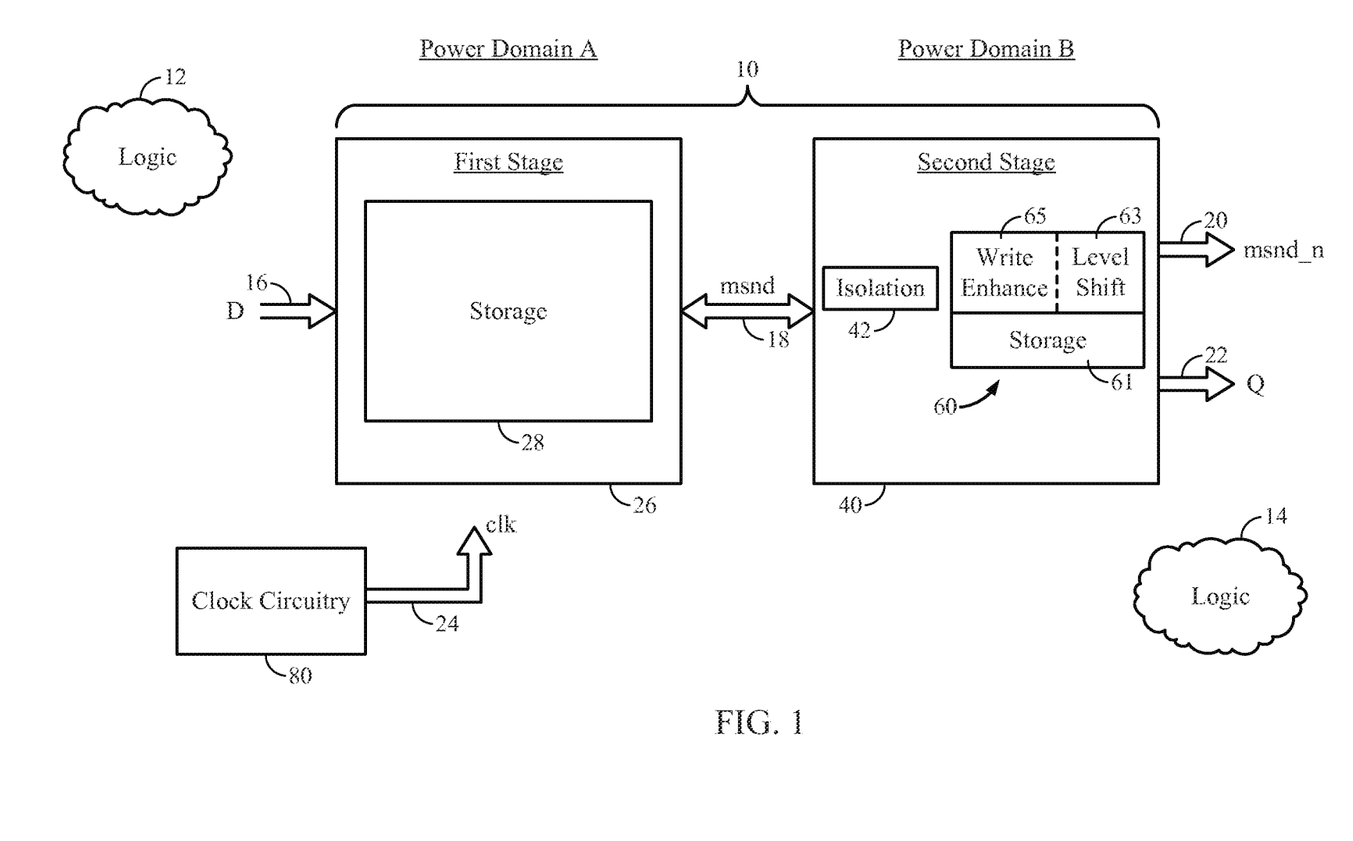
FIG. 1 is a block diagram of the disclosed embodiments.

Turning now to the specific disclosed embodiments, FIG. 1 is a block diagram of a multi-stage circuit 10 of the disclosed embodiments. As shown, the multi-stage circuit 10 includes a first stage 26 operating in power domain A, along with a second stage 40 operating in power domain B. Power domain A is different from power domain B. Logic circuits communicate data (e.g., D, msnd, msnd_n, Q) into and out of multi-stage circuit 10. Clock circuitry 80 provides clock signals (elk) for various synchronous components of the logic 12, 14 and multi-stage circuit 10. Data paths 16, 18, 20, 22, 24 are provided for transmitting data and clock signals to the various circuits. First stage 26 includes storage circuitry 28 operating in power domain A. Second stage 40 includes isolation circuitry 42 and level shifter storage circuitry (LSSC) 60 having storage functionality 61, level shift functionality 63 and or write enhancement functionality 65, all operating in power Domain B.

LSSC 60 performs both level shifting and data storage functions. More specifically, LSSC 60 shifts received data from power domain A to power domain B and writes the shifted, power domain B data to LSSC 60. Isolation circuitry 42 provides isolation between power domain A voltage signals and power domain B voltage signals, thereby reducing the potential for cross-talk between power domain A signals and power domain B signals. Write enhancement functionality 65 improves overall efficiency by decreasing the delay (i.e., write time delay) caused by the time it takes to write shifted, power domain B data to LSSC 60.

Figure 6:
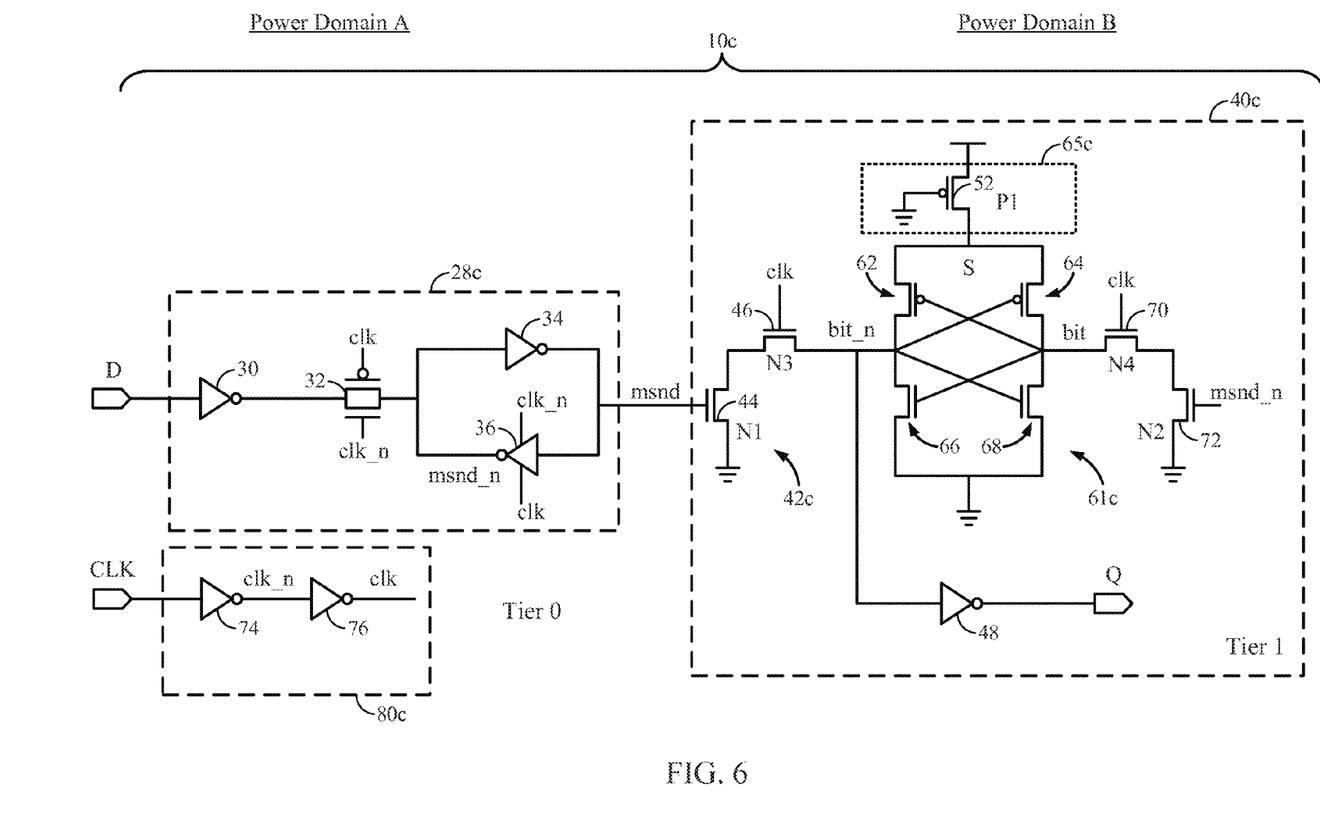
FIG. 6 is a more detailed implementation of the block diagram shown in FIG. 1.
Figure 7:
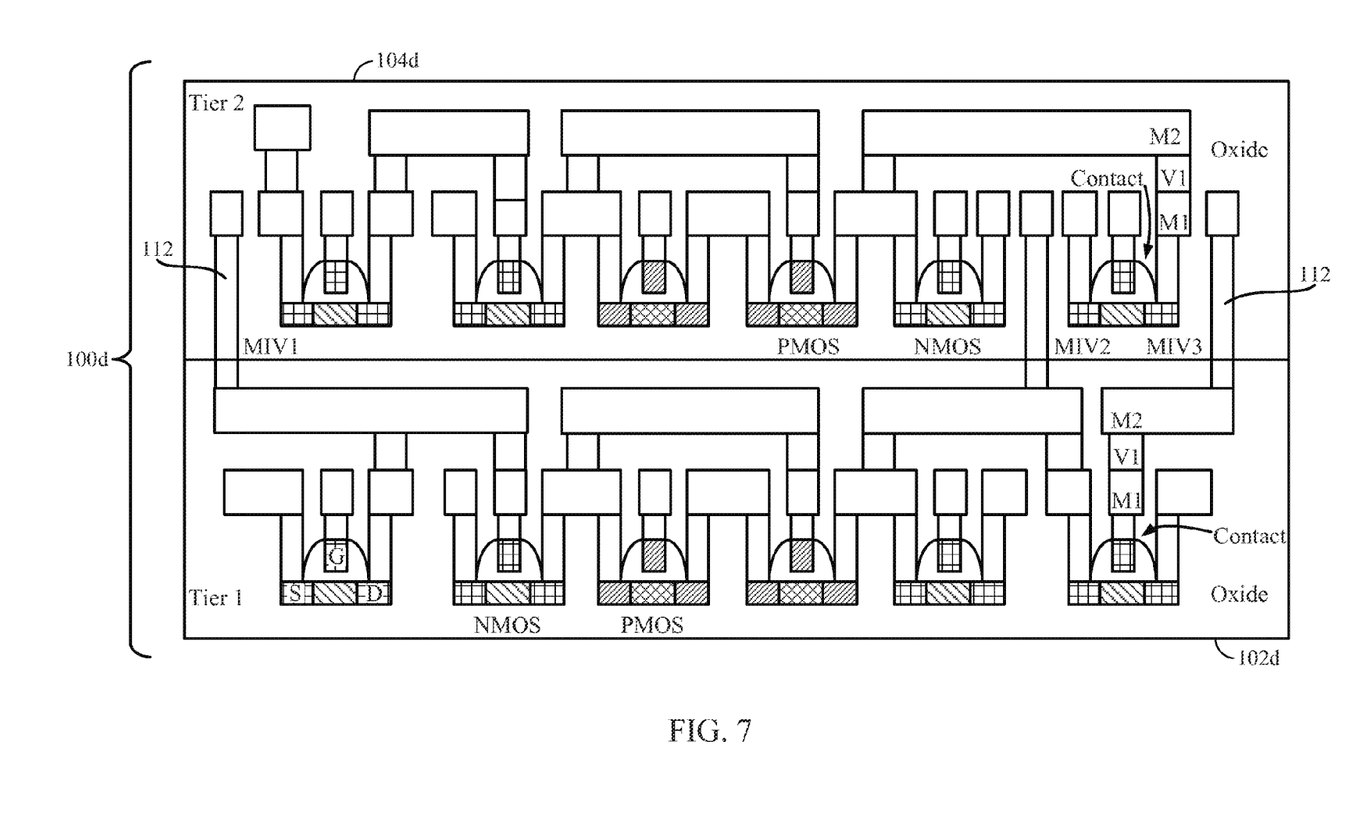
FIG. 7 is a cross section view of a flip flop implementation of the disclosed embodiments as a monolithic 3D integrated circuit.

One important aspect of the disclosed embodiments, and particularly the embodiment shown in FIG. 1, is that they allow the size of key circuit components (e.g., LSSC 60) to be reduced. If the disclosed LSSC 60 is implemented as an array of Metal Oxide Semiconductor Field Effect Transistors (MOSFET) (as shown in FIGS. 6 and 7 and described in more detail below), significant performance advantages (e.g., power and area consumption) could be achieved as the MOSFETs are scaled down in size.

Second stage 40 and its components (42, 60) allow LSSC 60 to be sized small enough that second stage 40 may be implemented without the performance penalties (e.g., area consumption, power consumption, writing delays, etc.) of known level shifter storage circuitry. As described in more detail below, the disclosed second stage 40 may sized as small as substantially the same footprint of a conventional slave stage. The isolation circuitry 42 eliminates cross-talk between the power domains A, B, thereby allowing the size of the LSSC 60 to be significantly reduced from known level shifter storage circuit implementations. Reducing the size of LSSC 60 reduces the overall area and power consumption of second stage 40. Because of the relatively smaller area and power consumption of LSSC 60, data writing speed and efficiency are improved. Further improvement is also provided in write enhancement functionality 65 to make it easier and faster to write data to LSSC 60. Isolation circuitry 42 and write enhancement functionality 65 may be implemented as simple designs having only a few active elements, thereby setting their power and area consumption relatively low. Thus, reducing the size of LSSC 60 reduces area and power consumption, while isolation circuitry 42 and write enhancement 65 improve efficiency (less cross-talk, better writing speed). The slight increase in area and power consumption from the addition of relatively simple isolation circuitry 42 and relatively simple write enhancement circuitry 65 in second stage 40 is more than offset by the area and power savings from reducing the size and footprint of the LSSC 60 and eliminating the need for a separate logic level shifter.

Thus, it can be seen that utilizing the circuit configurations described and illustrated herein, the area and power consumption of LSSC 60 can be significantly reduced. For example, when implementing LSSC 60 as the 6T (six transistor) Write Enhanced SRAM (WES) configuration 60c (shown in FIG. 6) following the disclosed embodiments, the footprint area of the 6T SRAM may be 80% or smaller than typical bitcell footprint at a given technology node, by sizing down the cross couple inverter latch. This is achieved by the additional pull down strength offered by the differential n-channel MOSFET input transistors (44, 46) which pull internal node bit_n to ground when input signal (msnd) is at high (while complementary input msnd_n is at low) and force the latch cell to charge internal node bit to high (Vdd of power domain B), thus transistors within LSSC 60c can be proportionally sized down to improve write power and efficiency.

Figure 2:
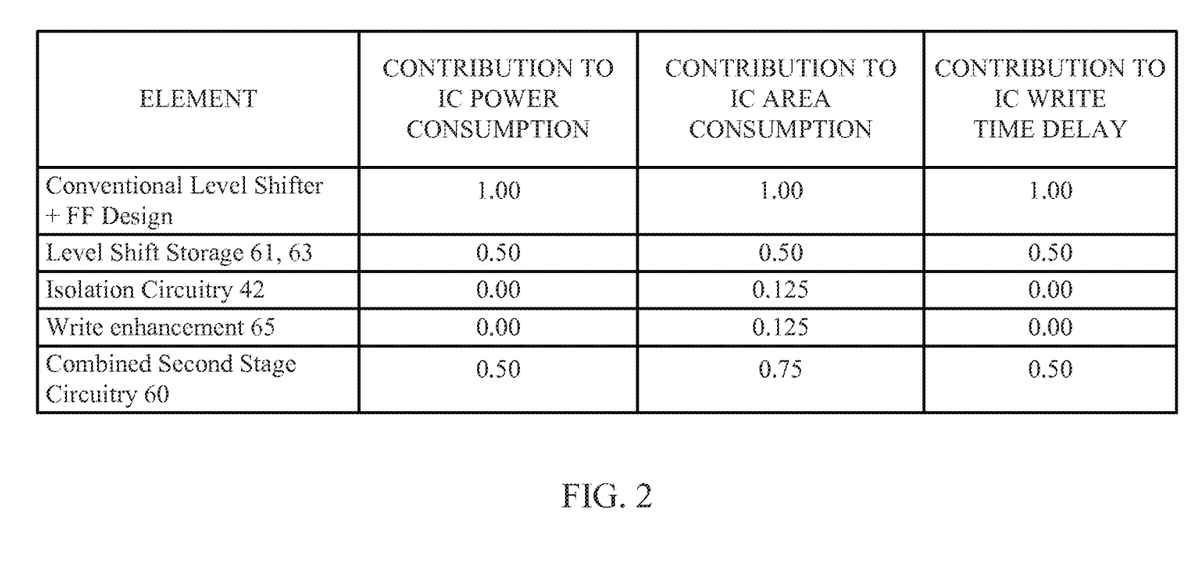
FIG. 2 is a table illustrating how various performance parameters may be improved by the disclosed embodiments.

FIG. 2 is a table illustrating an example of the power consumption, area consumption and IC delay benefits that can be achieved using the second stage circuit 40 shown in FIG. 1. FIG. 2 compares the power consumption, area consumption and IC delay of a conventional second stage level shifter and storage circuit relative to the second stage circuit 40 shown in FIG. 1. For purposes of illustration, the storage circuitry of the conventional design is a flip-flop (FF) circuit. Also for purposes of illustration and comparison, the contribution to overall second stage power consumption of the conventional level shifter+FF design is arbitrarily set at 1.00, the contribution to overall area consumption of the conventional level shifter+FF design is arbitrarily set at 1.00, and the contribution to IC delay is arbitrarily set at 1.00. Second stage level shifter and storage elements 61, 63 are continually reduced until their power consumption is, for example, 0.50, and their area consumption is, for example, 0.50. Isolation circuitry 42 is implemented as a simple circuit having few active elements such that it does not induce significant extra power consumption, and its area consumption is, for example, 0.125. Write enhancement 65 is implemented as a simple circuit having few active elements such that it does not induce significant extra power consumption, and its area consumption is, for example, 0.125. In more detailed embodiments described below, write enhancement is provided by the level shifter, so for these embodiments write enhancement's contribution to area consumption would be substantially zero. Additionally, write enhancement 65 reduces write delay such that the write times for second stage storage 61 are, for example, 0.50. Thus, the combined second stage circuitry 40 has a total power consumption of 0.50, a total area consumption of 0.75, and a total write time delay of 0.50. Thereby, the combined second stage circuitry 40 according to the disclosed embodiments provide power and area consumption savings, along with the improved writing efficiencies described above. The above-described embodiments allow the level shifting and storing circuitry to comprise less than approximately/about 70% of total circuitry area of the multi-stage circuit 10, and the entire level shifter integrated master-slave flip-flop design comprises less than approximately/about 50% of total footprint of a conventional FF+shifter design. It should be noted that the total circuitry area of the multi-stage circuitry refers to the sum of the circuitry areas of each stage.

Figure 3:
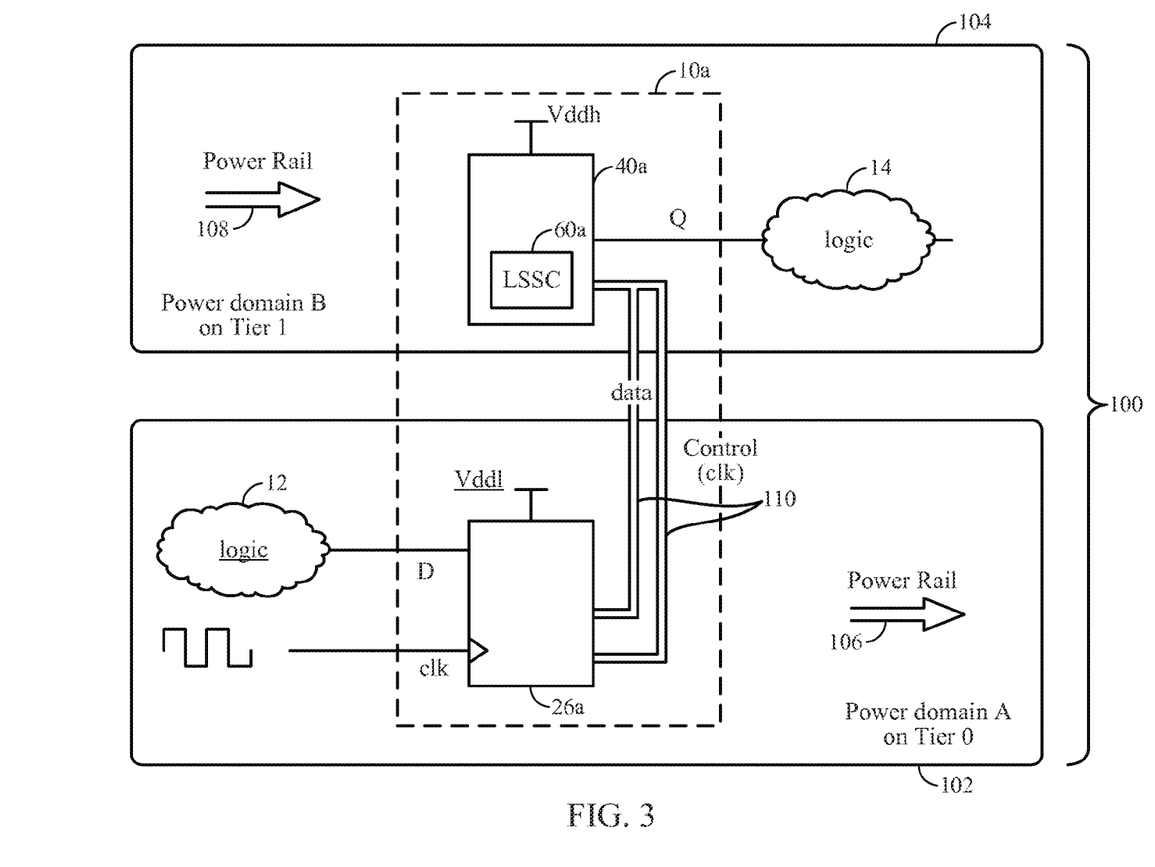
FIG. 3 is a block diagram illustrating a 2 tier example of the disclosed embodiments.

FIG. 3 illustrates multi-stage circuitry 10a implemented in a multi-tier circuit 100 having a first tier 102 operating in power domain A, along with a second tier 104 operating in power domain B. The first stage 26a of multi-tier circuit 10a is on first tier 102, and the second stage 40a of multi-tier circuit 10a is on second tier 104. Second stage 40a may or may not include the second stage circuitry (42, 65) shown in FIG. 1. Each power domain, A and B, typically requires its own power rail 106, 108. The multi-stage circuitry 10a implemented on multi-tier configuration 100 allows power rail 106 to be implemented on first tier 102, and power rail 108 to be implemented on second tier 104. Thus, per/tier power rail congestion is reduced over a single tier implementation of the multi-stage circuitry 10a.

Figure 4:
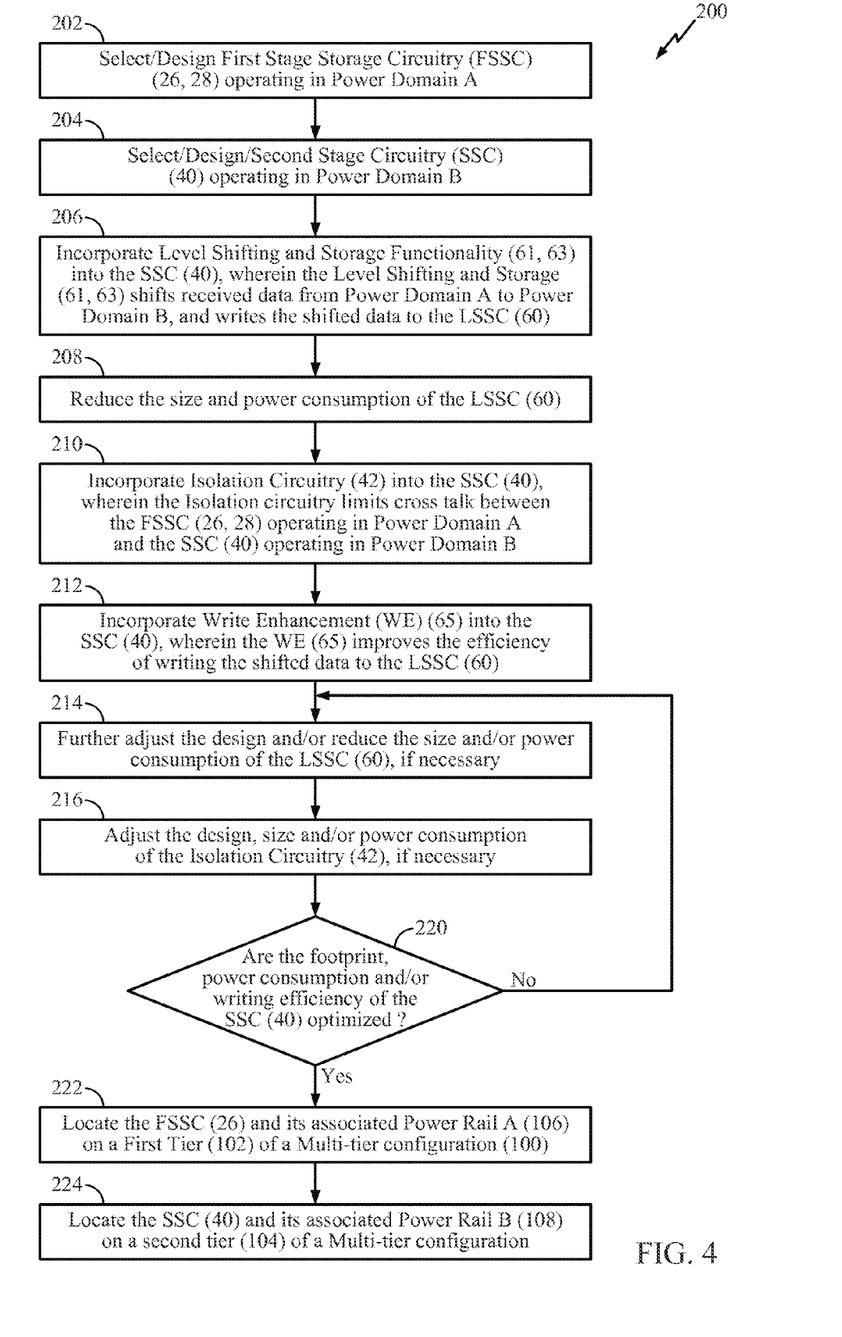
FIG. 4 is a flow diagram illustrating a method of the disclosed embodiments.
Figure 5:
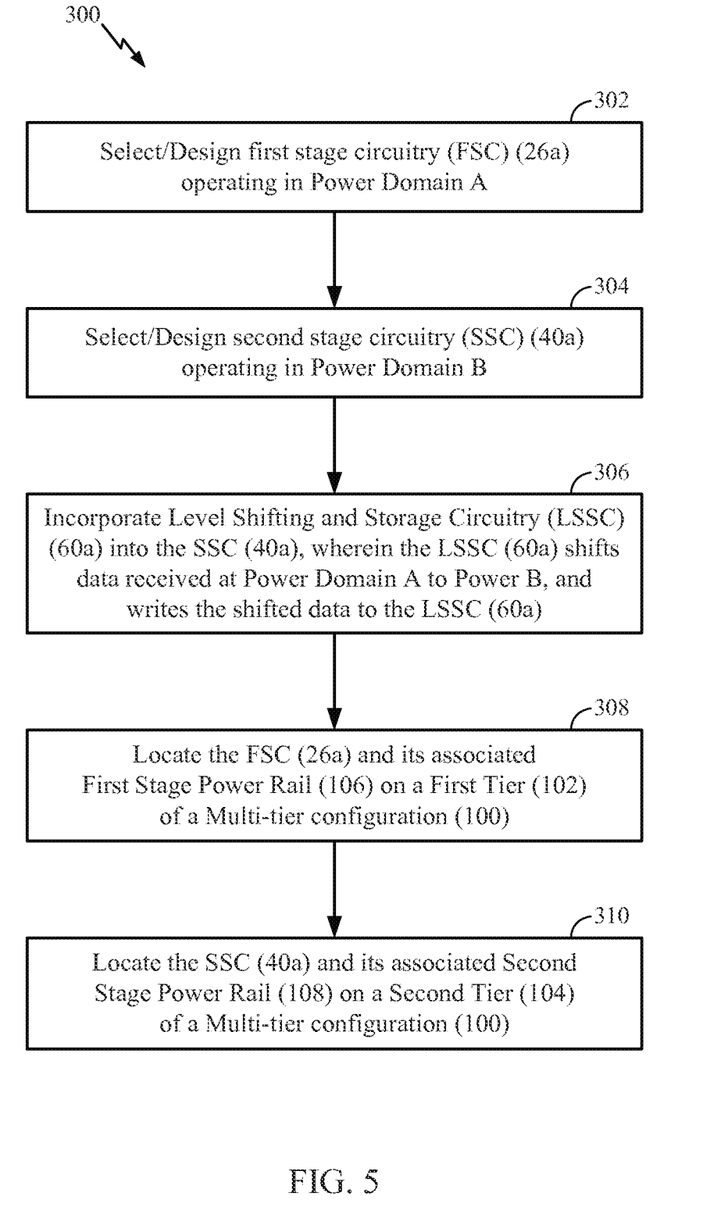
FIG. 5 is a flow diagram illustrating another method of the disclosed embodiments.

FIGS. 4 and 5 are process flow diagrams that further illustrate design techniques of the disclosed embodiments. FIG. 4 further illustrates a design technique 200 for the circuit topology shown in FIG. 1, and FIG. 5 further illustrates a design technique 300 for the circuit topology shown in FIG. 3. The sequence of design steps shown in FIGS. 4 and 5 are for illustration purposes only, and in actual practice the steps may or may not be performed in the order shown. For example reducing the size of LSSC 60 is an iterative, continuous evaluation that can be performed before, after or concurrently with other steps in the design process. As shown in FIG. 4, design technique 200 at step 202 selects and/or designs first stage storage circuitry (FSSC) 26, 28 operating in Power Domain A. Step 204 designs and/or select second stage circuitry (SSC) 40 operating in Power Domain B. Step 206 incorporates storage functionality 61 and level shift functionality 63 into SSC 40, wherein level shift 63 shifts received data from power domain A to power domain B, and writes the data to storage 61. Step 208 reduces the size and power consumption of LSSC 60. Step 210 incorporates isolation circuitry 42 into SSC 40, wherein isolation circuitry 42 limits cross talk between FSSC 26, 28 operating in power domain A and SSC 40 operating in power domain B. Step 212 incorporates write enhancement (WE) 65 into SSC 40, wherein WE 65 improves the efficiency of writing data to LSSC 60. Step 214 further adjusts the design and/or reduces the size and/or power consumption of LSSC 60, if necessary. Step 216 adjusts the design, size and/or power consumption of the isolation circuitry 42, if necessary. Step 220 evaluates whether the footprint, power consumption and/or writing efficiency of SSC 40 is optimized. If no, design technique 200 returns to step 214 and further adjusts the design and/or reduces the size and/or power consumption of LSSC 60, if necessary. If the answer to the inquiry at step 220 is yes, design technique 200 continues to step 222 and locates FSSC 26 and its associated first power rail A 106 on first tier 102 of multi-tier configuration 100. Step 224 locates SSC 40 and its associated second power rail 108 on second tier 104 of multi-tier configuration 100.

FIG. 5 illustrates an exemplary design technique 300 for the circuit topology 100 shown in FIG. 3. As shown in FIG. 5, step 302 selects and/or designs FSC 26a operating in power domain A. Step 304 selects and/or designs SSC 40a operating in power domain B. Step 306 incorporates LSSC 60a into SSC 40a, wherein LSSC 60a shifts data received at power domain A to power domain B, and writes the shifted data to LSSC 60a. Step 308 locates FSC 26a and its associated first stage power rail 106 on first tier 102 of multi-tier configuration 100. Finally, step 310 locates SSC 40a and its associated second stage power rail 108 on second tier 104 of multi-tier configuration 100.

FIG. 6 illustrates a multi-stage circuit 10c that is a more detailed implementation of multi-stage circuit 10 shown in FIG. 1. Multi-stage circuit 100c is shown in a master-slave flip-flop configuration wherein a first stage storage circuit 28c is implemented as a master flip-flop circuit operating in power domain A, and a second stage storage circuit 40c is implemented as a slave flip-flop configuration 61c, an isolation circuit configuration 42c and a write enhancement circuit configuration 65c, all operating in power domain B. Clock circuitry 80c provides clock signals (clk) for various synchronous components of multi-stage circuit 10c.

Master flip-flop circuit 28c includes a first inverter 30, a second inverter 34, and a third inverter 36, configured as shown. Slave storage circuit 40c synchronously receives data (msnd) from master flip flop 28a, shifts the received data from power domain A to power domain B and writes the data to storage circuit 61c. Isolation circuitry 42c includes a first input n-channel MOSFET (metal oxide semiconductor field effect transistor) 44, a second differential input n-channel MOSFET 46, and inverter 48 translating data to correct output Q state and providing isolation to output Q configured as shown. Write enhancement 65c is implemented as a first p-channel MOSFET 52 configured as shown. Level shifter storage circuitry 60a is implemented as a 6T SRAM configuration including a second p-channel MOSFET 62, a third p-channel MOSFET 64, a third n-channel MOSFET 66, a fourth n-channel MOSFET 68, a fifth n-channel MOSFET 70 and a sixth n-channel MOSFET 72, configured as shown. Clock circuitry 80a is implemented as piezoelectric crystal or pass gate 32, fourth inverter 74 and fifth inverter 76, configured as shown.

Figure 6A:
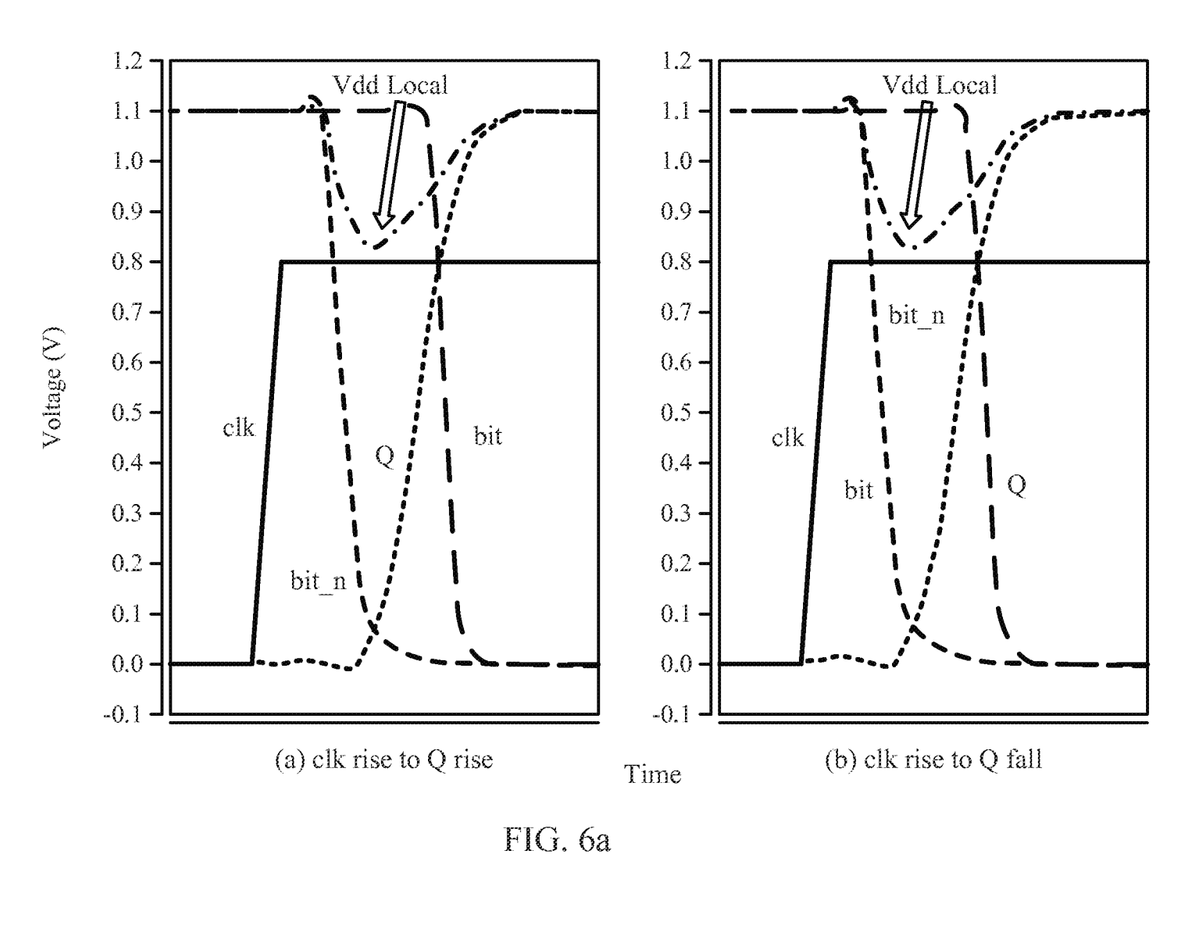
FIG. 6a is a graph illustrating the path of certain voltage signals over time for the circuit shown in FIG. 6.

The operation of the multi-stage circuit 10c will now be described in connection with FIG. 6 and the voltage/time graphs shown in FIG. 6a. In operation, input data D is synchronously stored in master flip-flop 28c at power domain A. Master flip-flop 28c in power domain A determines the FF setup & hold times. Data D (0 or 1) arrives at inverter 30 which inverts D to D_n and serves as voltage isolation to the input. When the clock signal goes high (1), pass gate 32 turns on and data D_n propagate into inverter 34 which translates data D_n back to D and presents an output state D at "msnd" to the gate of n-channel MOSFET 44 in the slave stage. A complementary D_n is also presented at msnd_n to the gate of n-channel MOSFET 46. Now, if clock signal goes low (0), pass gate 32 turns off. At the same time, inverter 36 is enabled by a conjugated clock signal, closing the back-to-back inverter latch loop and enabling a storage function to occur. The data D is now stored in the master stage, regardless of any later data state (0 or 1) that is presented to inverter 30 until the next clock cycle. To this point, all operations are conducted in power domain A and therefore, the stored and output data are all defined by the power domain A voltage level.

Msnd data is provided to first n-channel MOSFET 44 and complementary msnd_n to the second n-channel MOSFET 46. Unlike conventional approaches where msnd data is delivered to the pass gate transistor 70, the n-channel MOSFETs (44, 46) serves to (1) isolate power supplies between domain A and domain B; (2) function as slave stage data input ports; (3) provides extra pull down strength when the input signal is at high which allows storage unit 61c to be sized down with improved write performance.

If the msnd data D is high (1) at Vdd level of power domain A, n-channel MOSFET 44 turns on, while access transistor 70 turns on (selected) by the clock signal (clk). This combined action serves to pull "bit_n" to low (0) as shown in FIG. 6. As bit_n moves toward low, it turns on p-channel MOSFET 64 when Vdd-Vbit_n is larger than the threshold voltage of p-channel MOSFET 64 and shuts off n-channel MOSFET 68 when Vbit_n is lower than the threshold voltage of n-channel MOSFET 68. Consequently, node "bit" is charged by power supply Vdd and as "bit" level (voltage) continue to move up toward Vdd, it in turn shuts off p-channel MOSFET 62 and turns on n-channel MOSFET 66, a positive feedback latch is thus enabled, quickly pulling "bit_n" to ground while pushing "bit" to Vdd. Thus, a new state defined by data D is recorded (written) in the storage cell 61c. Inverter 48 now serves to invert "bit_n" at low (0) to Q at high (1). Because this portion of the operation is in power domain B, the output high also has the correct Vdd level of domain B. At this point, an input high (D=1) at power domain A voltage level is successfully transferred to an output high (Q=1) at power domain B voltage level. Similarly, if the msnd data D is low (0), the msnd_n is at high (1). The n-channel transistor 46 and p-channel transistor 62 are turned on, forcing bit_n to be charged by Vdd and writing the data to the storage cell 61c and in turn converting a high bit_n signal (1) to a correct low output data (Q=0).

Thus, the multi-stage circuit 10c transfers an input data D to a correct output Q state across 2 different power domains. Additional enhancement of the write efficiency is provided using the self induced power collapsing (SIPC) circuitry which is an all-time on p-channel MOSFET 52 connecting the storage circuitry 61c and power supply. As described above, the storage circuitry 61c provides a latch function to set the storage state, e.g. switching "bit_n" from high (1) to low (0) and "bit" from low (0) to high (1). The switching speed is determined primarily by how fast "bit_n" voltage can be pulled down. However, during the initial transient when the "bit" voltage is not charged up to Vdd–Vbit_n, transistor 62 is still on which will continue charging "bit_n". The voltage of "bit_n" is not determined by the competing forces of pull-up by p-channel transistor 62 and pull-down by n-channel transistors 44 and 66. The SIPC overcomes this transient problem by suppressing the internal biasing voltage at node S which loads the transistors 62 and 64. In the transient period, current is conducting through the all-time on p-channel transistor 52. The transistor is sized that it delivers adequate voltage drop, e.g. 20-30% voltage drop from Vdd supply at transient but recover to Vdd when the storage cell starts to latch as shown in FIG. 6a. Such enhancement alone achieves approximately 20% improvement to clk-to-Q delay.

FIG. 7 illustrates an exemplary cross section view of a portion of the master-slave FF circuit 10c of FIG. 6 implemented in a monolithic 3D integrated circuit 100d having a first tier 102d operating in power domain A and a second tier 104d operating in power domain B. The cross section is an implementation example that is not intended to show all interconnections. The illustrated design is utilized in monolithic 3D integrated circuits, which only needs a single power rail (not shown) on each tier to realize a multi power domain data transfer interface. This can largely reduce the layout area and reduce the physical design complexity. The master stage and the slave level shifter stage have similar total transistor width, and are separated evenly into the two tiers 102, 104 for better footprint efficiency. FIG. 7 depicts an example where the master and slave stages of the design are connected by monolithic inter-tier vias. MIV1 (112) illustrates the connection from drain (D) of pass gate transistor 30 of the master stage in tier 0 to the input transistor 46 of slave stage (not shown) in tier 1 of FIG. 6, providing the cross tier data path for msnd_n. MIV2 (116) illustrates the connection from the output of inverter 34 in tier 0 to the input transistor 44 of slave stage in tier 1 (not shown) of FIG. 6, providing the cross tier data path for msnd. MIV3 (114) can be a link for the clock fed by clock generator block 80 of FIG. 6. The NMOS and PMOS and contact, M1, M2, V1 in each tier are components connecting circuits of corresponding circuitry of the master and slave stages. One embodiment uses 2 layers of metal for connection as shown in FIG. 7.

Thus, it can be seen that the disclosed embodiments are highly compact, highly reliable and low power components and circuits that operate effectively across power domains. The disclosed embodiments further provide both delay improvement and energy savings. In one embodiment, it achieves 40% clock-Q delay reduction and over 50% of power saving compared to known approaches. The energy-delay product is reduced by 55%. The improved performance parameters and reduced component footprint ensure design robustness, and the 3D integrated circuit implementation techniques are essential for cross tier, cross domain synchronized data transfer in future multi-power domain 3D IC systems. Further, sizing down the level shifter storage also helps write speed and efficiency. The entire write enhancement techniques thus include 2 primary components: (1) a self-induced power collapsing technique (e.g., the p-channel MOSFET header cell), thereby reducing the write power and time; (2) reduce the footprint of the level shifter storage latch pairs, thereby reducing the charging capacitance, which is possible because the differential input transistors (for isolation) provide extra pull down strength during a write operation.

While the foregoing disclosure and illustrations show embodiments of the invention, it should be noted that various changes and modifications could be made herein without departing from the scope of the invention as defined by the appended claims. For example, the functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

Those of skill in the relevant arts will also appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. Accordingly, an embodiment of the invention can include a computer readable media embodying a method for performing the disclosed and claimed embodiment. Accordingly, the invention is not limited to illustrated examples and any means for performing the functionality described herein are included in embodiments of the invention.

What is claimed is:

1. A multi-tier integrated circuit comprising:
a multi-stage circuit configuration comprising a first stage operating in power domain A and a second stage operating in power domain B;
said first stage comprising first means for storing data;
said second stage comprising means for level shifting and storing data;
a first tier;
a second tier;
said first tier comprising said first stage and means for providing power to said first stage; and
said second tier comprising said second stage and means for providing power to said second stage.

2. The integrated circuit of claim 1 wherein:
said means for providing power to said first stage comprises a first power rail; and
said means for providing power to said second stage comprises a second power rail.

3. The integrated circuit of claim 2 further comprising means for transporting data between said first stage and said second stage.

4. The integrated circuit of claim 3 wherein said means for transporting data comprises a network of vias.

5. The integrated circuit of claim 4 wherein said network of vias comprises monolithic inter-tier vias.

6. A multi-stage circuit configuration comprising:
a first stage operating in power domain A;
said first stage comprising first means for storing data;
a second stage operating in power domain B;
said second stage comprising means for isolating said first stage operating in power domain A from said second stage operating in power domain B;
said second stage further comprising means for level shifting and storing data in power domain B; wherein said means for level shifting and storing further comprises means for enhancing writing data to said means for level shifting and storing;
a first tier and a second tier;
said first tier comprising said first stage and means for providing power to said first stage; and
said second tier comprising said second stage and means for providing power to said second stage.

7. The configuration of claim 6 wherein:
said means for providing power to said first stage comprises a first power rail; and
said means for providing power to said second stage comprises a second power rail.

8. The configuration of claim 7 further comprising means for transporting data between said first stage and said second stage.

9. The configuration of claim 8 wherein said means for transporting data comprises a network of vias.

10. The configuration of claim 9 wherein said network of vias comprises monolithic inter-tier vias.

11. The configuration of claim 6 wherein:
said means for storing data comprises a master flip-flop;
said means for level shifting and storing data comprises a slave flip-flop and level shifter circuitry.

12. The configuration of claim 11 wherein said slave flip-flop and level shifter comprises a plurality of SRAM transistors.

13. The configuration of claim 11 wherein said means for level shifting and storing data comprises less than about 70% of a total circuitry area of the multi-stage circuit configuration.

14. The configuration of claim 6 wherein said means for isolating comprises common source n-channel MOSFETs.

15. The configuration of claim 6 wherein said means for enhancing comprises an always on p-channel MOSFET header.

16. A multi-stage circuit configuration comprising:
a first stage operating in power domain A, the first stage comprising a storage circuit;
a second stage operating in power domain B;
said second stage comprising level shifter storage circuitry and a self-induced power collapsing circuit coupled to the level shifter storage circuitry; and
said second stage further comprising isolation circuitry to receive an input signal from the storage circuit.

17. The configuration of claim 16 wherein said level shifter storage circuitry further comprises write enhancement functionality.

18. The configuration of claim 17 further comprising:
a first tier and a second tier;
said first tier comprising said first stage and a first stage power rail; and
said second tier comprising said second stage and a second stage power rail.

19. The configuration of claim 18 further comprising a network of vias for transmitting data between said first stage and said second stage.

20. The configuration of claim 19 wherein said network of vias comprises monolithic inter-tier vias.

21. The configuration of claim 17 wherein:
said first stage comprises a first flip-flop circuit; and
said level shifter storage circuitry comprises a second flip flop circuit.

22. The configuration of claim 17 wherein said write enhancement improves the efficiency of writing the data to said level shifter storage circuitry.

23. The configuration of claim 22 wherein said write enhancement comprises a p-channel MOSFET.

24. The configuration of claim 16 wherein:
said first flip-flop circuit comprises a master flip-flop configuration; and
said second flip-flop circuit comprises a slave flip-flop configuration.

25. The configuration of claim 24 wherein said slave flip-flop configuration comprises an SRAM cell.

26. The configuration of claim 16 wherein said isolation circuitry limits cross-talk between said first stage operating in power domain A and said level shifter storage circuitry operating in power domain B.

27. The configuration of claim 26 wherein said isolation circuitry comprises differential n-channel MOSFETs.

28. A computer-readable storage medium having instructions stored to cause a processor to perform a method of designing a multi-stage circuit, the method comprising:
designing a first stage circuit operating in power domain A;
designing a second stage circuit operating in power domain B;
incorporating level shifter storage circuitry into said second stage circuit, wherein said level shifter storage circuit shifts data received at power domain A to power domain B, and writes said shifted data to said level shifter storage;
locating said first stage circuit and a first stage power rail on a first tier of a multi-tier configuration; and
locating said second stage circuit and second stage power rail on a second tier of said multi-tier configuration.

29. A computer-readable storage medium having instructions stored to cause a processor to perform a method of designing a multi-stage circuit, the method comprising:
designing a first stage storage circuit operating in power domain A;
designing a second stage circuitry operating in power domain B;
incorporating level shifter storage circuitry into said second stage circuitry, wherein said level shifter storage circuitry shifts received data from power domain A to power domain B, and writes said shifted data to said level shifter storage circuitry;
incorporating write enhancement into said level shifter storage circuitry, wherein said write enhancement improves an efficiency of writing said shifted data to said level shifter storage circuitry;
reducing a size and a power consumption of said level shifter storage circuitry;
incorporating isolation circuitry into said second storage circuitry, wherein said isolation circuitry limits cross talk between said first stage storage circuitry operating in power domain A and said second stage circuitry operating in power domain B;
further adjusting said design or reducing said size or power consumption of said level shifter storage circuitry, if necessary; and
adjusting said design, size and/or power consumption of said isolation circuitry, if necessary.

30. The computer-readable medium of claim 29, the method further comprising the steps of:
evaluating whether said size, power consumption and/or writing efficiency of said second stage circuitry are optimized;
further adjusting said design or reducing said size or power consumption of said level shifter storage circuitry, if necessary; and
adjusting said design, size and/or power consumption of said isolation circuitry, if necessary.

31. The computer-readable medium of claim 30, the method further comprising the steps of;
locating said first stage storage circuitry and a first stage power rail on a first tier of a multi-tier configuration; and
locating said second storage circuit and a second stage power rail on a second tier of said multi-tier configuration.

32. The computer-readable medium of claim 29 wherein:
said first stage comprises a first flip-flop circuit; and
said level shifter storage circuitry comprises a second flip flop circuit.

33. The computer-readable medium of claim 32 wherein:
said first flip-flop circuit comprises a master flip-flop configuration; and
said second flip-flop circuit comprises a slave flip-flop configuration.

34. The computer-readable medium of claim 33 wherein said slave flip-flop configuration comprises an SRAM cell.

35. The computer-readable medium of claim 32 wherein said isolation circuitry limits cross-talk between said first stage operating in power domain A and said level shifter storage circuitry operating in power domain B.

36. The computer-readable medium of claim 35 wherein said isolation circuitry comprises differential n-channel MOSFETs.

37. The computer-readable medium of claim 29 wherein said write enhancement improves the efficiency of writing the data to said level shifter storage circuitry.

38. The computer-readable medium of claim 37 wherein said write enhancement comprises a p-channel MOSFET.

* * * * *